(12) United States Patent
Silveira Filho et al.

(10) Patent No.: US 9,423,432 B2
(45) Date of Patent: Aug. 23, 2016

(54) TRACKING ELECTRICAL APPLIANCE USAGE

(71) Applicant: THOMSON LICENSING, Issy de Moulineaux (FR)

(72) Inventors: Fernando Jorge Silveira Filho, Palo Alto, CA (US); Anmol Nalin Sheth, San Francisco, CA (US); Christophe Diot, Paris (FR); Daniel Garnier-Moiroux, Paris (FR)

(73) Assignee: THOMSON LICENSING, Issy les Moulineaux (FR)

( * ) Notice: Subject to any disclaimer, the term of this patent is extended or adjusted under 35 U.S.C. 154(b) by 430 days.

(21) Appl. No.: 14/137,296

(22) Filed: Dec. 20, 2013

(65) Prior Publication Data

US 2015/0177292 A1    Jun. 25, 2015

(51) Int. Cl.
   *G01R 21/00* (2006.01)
   *G01R 19/25* (2006.01)
   *G01R 21/06* (2006.01)
   *G01R 21/133* (2006.01)

(52) U.S. Cl.
   CPC ....... *G01R 19/2513* (2013.01); *G01R 21/1333* (2013.01)

(58) Field of Classification Search
   CPC .................................................. G01F 19/2513
   See application file for complete search history.

(56) References Cited

U.S. PATENT DOCUMENTS

| | | | |
|---|---|---|---|
| 6,891,838 B1 | 5/2005 | Petite et al. | |
| 7,124,101 B1 | 10/2006 | Mikurak | |
| 7,778,734 B2 | 8/2010 | Oswald et al. | |
| 8,032,233 B2 | 10/2011 | Forbes, Jr. et al. | |
| 8,095,340 B2 | 1/2012 | Brown | |
| 8,131,403 B2* | 3/2012 | Forbes, Jr. ............. | G06Q 10/00 700/295 |
| 8,170,524 B2 | 5/2012 | Abbot et al. | |
| 8,239,073 B2 | 8/2012 | Fausak et al. | |
| 2012/0080949 A1* | 4/2012 | Gelonese .................. | H02J 3/14 307/31 |

* cited by examiner

*Primary Examiner* — Phuong Huynh
(74) *Attorney, Agent, or Firm* — Brian J. Dorini; Lily Neff

(57) ABSTRACT

A system for tracking usage patterns of electrical appliances is disclosed. The system comprises a central database configured to receive and store information; a plurality of energy sensors each of the plurality of sensors being configured to measure a change in electrical energy use by a corresponding one of a plurality of electrical appliances; at least one presence sensor configured to determine when at least one user is proximate to the plurality of electrical appliances and send presence information to the central database; and a processor configured to extract features from such information and create at least one user profile corresponding to the at least one user and a pattern of electrical energy use associated with the at least one user based on said features.

8 Claims, 2 Drawing Sheets

TRACKING ELECTRICAL APPLIANCE USAGE

BACKGROUND

The digital home of the future is envisioned to be a mix of sensing and computing infrastructure that seamlessly interacts with the user to enable a wide range of personalized digital home applications and services. Examples include recommending content by identifying who is watching television, personalizing the settings of an appliance based on who is using it, and personalizing the cooking experience based on who is performing the activity in the home. A key component of many such applications is a non-intrusive and seamless user identification and tracking technique to personalize the experience for the user.

Existing approaches for user tracking and identification are cumbersome as they are either limited to individual devices that require explicit feedback from the user or make use of invasive sensors like microphones and cameras. Approaches requiring users to log in or pick a profile are limited to a handful of devices in the home, like smart TVs and media devices, and are often from the same manufacturer. Such approaches cannot provide seamless user tracking and identification across multiple heterogeneous devices in the home. Other approaches that require the installation of sensors like cameras and microphones raise several privacy concerns and are fragile to environmental conditions like poor lighting or background noise.

SUMMARY

In view of the foregoing background, a system for tracking usage patterns of electrical appliances is disclosed. The system includes a central database configured to receive and store usage information, such as energy consumption information, timing information, and user identification and presence information. The system also includes a plurality of energy sensors connected to a plurality of electrical appliances, with each of the plurality of sensors being configured to measure a change in electrical energy use by a corresponding one of the plurality of electrical appliances. The plurality of energy sensors send appliance monitoring information to the central database, wherein the appliance monitoring information includes timing information and power consumption information regarding the electrical energy use.

Also included is at least one presence sensor that is configured to determine when at least one user is proximate to the plurality of electrical appliances. The presence sensor sends presence information to the central database, wherein the presence information includes timing and identification information regarding the at least one user. The system further includes a processor configured to extract features that from the appliance monitoring information and the presence information that characterize interactions between the at least one user and the plurality of electrical devices, and create at least one user profile corresponding to the at least one user based on the features.

Also disclosed is a method for tracking usage patterns of electrical appliances. The method includes receiving appliance monitoring information from a plurality of energy sensors, the plurality of energy sensors being connected to a plurality of electrical appliances and being configured to measure a change in electrical energy use by the plurality of electrical appliances, the appliance monitoring information including timing information and power consumption information regarding the electrical energy use; receiving presence information from at least one presence sensor, the presence sensor being configured to determine when at least one user is proximate to the plurality of electrical appliances, the presence information including timing information and power consumption information regarding the electrical energy use; and extracting features from the appliance monitoring information and the presence information, the features characterizing interactions between the at least one user and the plurality of electrical devices; and creating at least one user profile corresponding to the at least one user based on the features.

BRIEF DESCRIPTION OF THE DRAWINGS

For a more complete understanding of the present invention, reference is made to the following detailed description of an embodiment considered in conjunction with the accompanying drawings, in which.

DETAILED DESCRIPTION

The present disclosure relates to a system for user identification and tracking with respect to electrical appliance use, such as, for example, kitchen and bathroom appliances. The system is able to identify which users use a particular electrical appliance by profiling and learning the unique appliance usage patterns across the different users having access to the room in which the electrical appliance resides. Appliance usage information is obtained by monitoring the energy consumption of individual appliances using smart meters and/or distributed smart plugs.

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces. Other elements can be implemented through the use of specifically-purposed devices, such as electronic display screens and electronic sensors.

Figure 1:
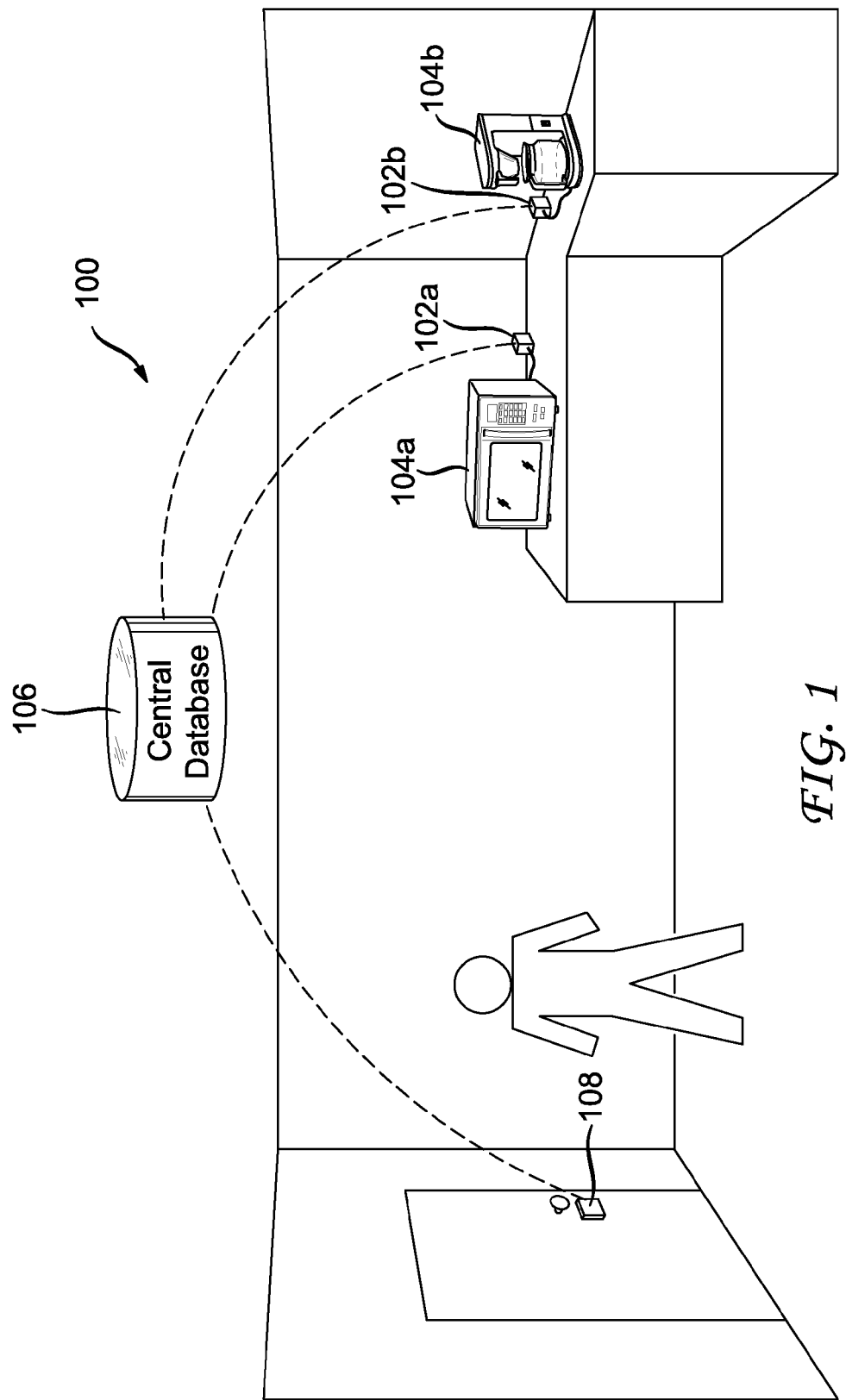
FIG. 1 is a diagram showing a room in which a system for tracking usage patterns in electrical appliances in accordance with an embodiment of the present invention is employed.

FIG. 1 illustrates a system 100 constructed in accordance with an embodiment of the present invention. The system includes a plurality of energy sensors 102a, 102b that are connected to a corresponding number of electrical appliances 104a, 104b. The electrical appliances 104a, 104b can include any commonly used electrical appliance, including kitchen appliances such as, for example, a microwave oven or a coffee maker (as seen in FIG. 1), entertainment appliances such as, for example, a television or a video game console, bathroom appliances, and/or appliances commonly associated with an office setting. The energy sensors 102a, 102b collect energy consumption data, which includes information regarding the time one of the electrical appliances 104a, 104b was used and how much energy was consumed by the appliance during that time. This energy consumption data is then transmitted to a central database 106 for processing. In one embodiment, the plurality of energy sensors 102a, 102b include smart meters and/or distributed smart plugs.

Still referring to FIG. 1, the system 100 also includes at least one presence sensor that detects and records the presence of a person entering the room in which the electrical appliances 104a, 104b reside. In one embodiment, the presence sensor is an electronic security key door lock 108 that is opened by an external key fob. In another embodiment, the presence sensor is a wireless receiver station that reads the media address control (MAC) address of the various smart phones in the area and records their presence. The at least one presence sensor identifies the name and time of each user entering the room, as well as the time in which the user enters the room, and contemporaneously transmits such information to the central database 106 for processing. In one embodiment, the at least one presence sensor 108 also identifies when a user leaves after entering.

The system 100 also includes the central database 106 referenced above, which includes a memory and a processor. The central database 106 is configured to receive and record information transmitted from the plurality of energy sensors 102a, 102b and the at least one presence sensor. The central database 106 also uses such information to create user profiles for each of the users identified in the presence data that indicate each user's pattern of behavior when using the electrical appliances 102a, 102b. In one embodiment, the central database employs Support Vector Machines ("SVMs") that learn the per-appliance usage patterns of the users to build the user profiles.

Figure 2:
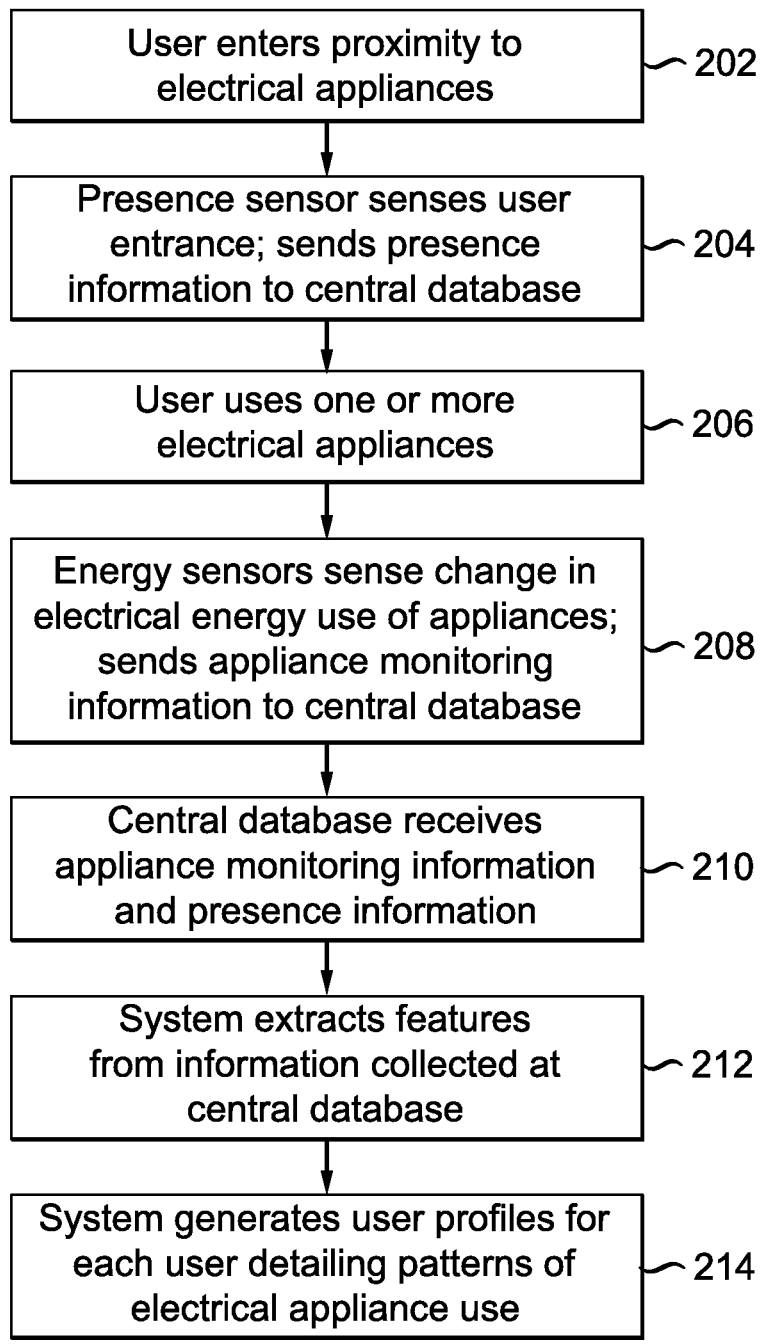
FIG. 2 is a flow chart showing a method of tracking usage patterns in electrical appliances in accordance with an embodiment of the present invention.

FIG. 2 illustrates a method of tracking usage patterns of electrical appliances in accordance with an embodiment of the present invention. The method begins with a user entering close proximity to the electrical appliances 104a, 104b (step 202). The presence sensor senses the user's entrance and sends a signal to the central database noting the time of entrance and the identity of the user (step 204). In the embodiment shown in FIG. 1, this is accomplished by the user, for example, unlocking the security key door lock 108 to the door through use of a personalized key fob, and the security key door lock 108 noting the identity of the user and the time of the user's entrance through the unique signal received from the user's key fob.

Thereafter, the user begins using one or more of the electrical appliances 104a, 104b (step 206). These energy sensors 102a, 102b measure the changes in electrical energy use by the electrical appliances 104a, 104b associated with the user's use. The energy sensors then transmit signals including appliance monitoring information to the central database 106, wherein such appliance monitoring information notes the amount of each change in energy use and the timing of each change in energy use (step 208).

The central database receives the appliance monitoring information and the presence information from the energy sensors and the presence sensor, respectively (step 210). The system then extracts features from the energy consumption and presence information collected at the central database (step 212). These features characterize the interactions between the user and the electrical appliances.

For example, the presence information can indicate that User A entered the room in FIG. 1 at time X, while the appliance monitoring information can include changes in electrical energy usage by the electrical appliances 104a, 104b that occurred within Y seconds after User A's presence was recorded at time X. This information would indicate that between time X and time X+Y, the user was making use of the electrical appliances 104a, 104b. Furthermore, the appliance monitoring information can indicate how long User A was using the electrical appliances 104a, 104b based on the degrees of change in energy consumption occurring from between time X and time X+Y. Further such features can be aggregated with the previous example of features to identify patterns of behavior associated with User A that can be used to predict when and for how long User A will use the electrical appliances 104a, 104b.

With the desired features extracted from the appliance monitoring information and the presence information, the system can create user profiles associated with the identified users of the electrical appliances 104a, 104b (step 214). These user profiles show patterns of behavior associated with the users identified by the presence sensor over time. The user profiles can then be used to predict electrical appliance usage by a particular user whenever the user is identified.

The systems and methods disclosed herein carry many benefits over prior systems. For example, the system's energy sensors are easy to use. Smart plugs and energy meters can be used to serve as such sensors, and they are simple to install in a home or office setting. Such devices are also inexpensive and do not require replacing batteries because they connect to the electrical appliance's power source. In addition, the disclosed system provides support for heterogeneous appliances. Identifying appliance usage by monitoring their energy consumption does not require any cooperation between the appliances, thereby allowing the system to operate seamlessly across heterogeneous appliances in a home or office setting. Furthermore, the disclosed system is transparent to the user and does not require any explicit feedback from the user.

The various embodiments disclosed herein can be implemented as hardware, firmware, software, or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It will be understood that the embodiments described herein are merely exemplary and that a person skilled in the art may make many variations and modifications without departing from the spirit and scope of the invention. All such variations and modifications are intended to be included within the scope of the invention as defined in the appended claims.

The invention claimed is:

1. A system for tracking usage patterns of electrical appliances, the system comprising
a central database configured to receive and store information from:
a plurality of energy sensors connected to a corresponding one of a plurality of electrical appliances, each of the plurality of sensors being configured to measure a change in electrical energy use by the corresponding one of the plurality of electrical appliances and send appliance monitoring information to the central database, the appliance monitoring information including timing information and power consumption information regarding the electrical energy use; and
at least one presence sensor configured to determine when at least one user is proximate to the plurality of electrical appliances and send presence information to the central database the presence information including timing and identification information regarding the at least one user; and
a processor configured to interact with the central database to extract features from the appliance monitoring information and the presence information and create at least one user profile corresponding to the at least one user and a pattern of electrical energy use associated with the at least one user based on the features, wherein the features characterize interactions between the at least one user and the plurality of electrical appliances.

2. The system of claim 1, wherein the plurality of energy sensors include smart plugs or energy meters.

3. The system of claim 1, wherein the plurality of electrical appliances are heterogeneous and do not cooperate with each other.

4. The system of claim 1, wherein the change in energy usage measured by each of the plurality of energy sensors includes a change in electrical power consumption by each of the plurality of electrical appliances.

5. The system of claim 1, wherein the at least one presence sensor is selected from the group consisting of an electronic security key door lock and a wireless receiver station.

6. The system of claim 1, wherein the presence information includes an indication that the at least one user has entered close proximity to the plurality of electrical appliances and an indication that the at least one user has left close proximity to the plurality of electrical appliances.

7. The system of claim 1, wherein the processor incorporates a Support Vector Machine to extract the features and create the user profiles.

8. A method of tracking usage patterns of electrical appliances, the method comprising:
receiving appliance monitoring information from a plurality of energy sensors the plurality of energy sensors being connected to a plurality of electrical appliances and being configured to measure a change in electrical energy use by the plurality of electrical appliances the appliance monitoring information including timing information and power consumption information regarding the electrical energy use;
receiving presence information from at least one presence sensor the presence sensor being configured to determine when at least one user is proximate to the plurality of electrical appliances the presence information including timing and identification information regarding the at least one user; and
extracting features from the appliance monitoring information and the presence information, the features characterizing interactions between the at least one user and the plurality of electrical appliances; and
creating at least one user profile corresponding to the at least one user and a pattern of electrical energy use associated with the at least one user based on said features.

* * * * *